United States Patent
Hall et al.

(10) Patent No.: US 6,712,261 B2
(45) Date of Patent: Mar. 30, 2004

(54) SOLID CONDUCTIVE ELEMENT INSERTION APPARATUS

(75) Inventors: Richard R. Hall, Endwell, NY (US); How T. Lin, Vestal, NY (US); Christopher J. Majka, Owego, NY (US); Matthew F. Seward, Windsor, NY (US); Ronald V. Smith, Friendsville, PA (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 10/102,129

(22) Filed: Mar. 20, 2002

(65) Prior Publication Data

US 2003/0178471 A1 Sep. 25, 2003

(51) Int. Cl.$^7$ ................................................. B23K 31/02
(52) U.S. Cl. ....................... 228/180.5; 228/254; 228/13; 219/121.65
(58) Field of Search .............................. 228/4.5, 180.5, 228/245–247, 254, 13, 41; 219/129, 121.63, 121.64, 121.65

(56) References Cited

U.S. PATENT DOCUMENTS

| | | | |
|---|---|---|---|
| 3,672,047 A | * | 6/1972 | Sakamoto et al. ............ 29/854 |
| 5,953,624 A | | 9/1999 | Bando et al. |
| 6,098,868 A | | 8/2000 | Mae et al. |
| 6,478,212 B1 | * | 11/2002 | Engel et al. ................. 228/5.7 |

* cited by examiner

*Primary Examiner*—M. Alexandra Elve
*Assistant Examiner*—Len Tran
(74) *Attorney, Agent, or Firm*—Scully, Scott, Murphy & Presser; Arthur J. Samodovitz

(57) ABSTRACT

An arrangement and method for the insertion the leading end of a length of a metallic element into a through hole which is formed in a substrate, and for heat deforming the inserted leading portion of the metallic element into a predetermined configuration prior to severing therefrom the remaining length of the metallic element.

20 Claims, 2 Drawing Sheets

SOLID CONDUCTIVE ELEMENT INSERTION APPARATUS

BACKGROUND OF THE INVENTION

1. Field of the Invention

Figure 1:
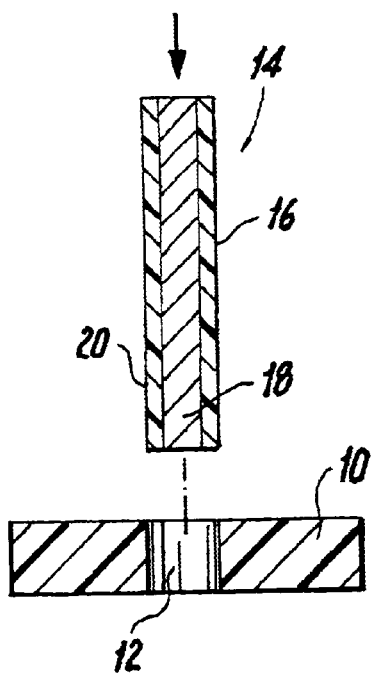

The present invention relates to an arrangement for the insertion of a metallic element into a hole or aperture which is formed in a substrate, and for deforming the inserted portion of the metallic element into a predetermined configuration prior to severing therefrom the remaining externally extending portion of the metallic element. Moreover, the invention is also directed to a method for effecting the insertion of a metallic element into a hole or aperture which is provided in a substrate, deforming the inserted portion of the metallic element into a predetermined configuration and severing the remaining external portion of the metallic element therefrom.

In the electronic packaging technology, particularly relative to the manufacture of electrically conductive components for semiconductor devices, there are frequently employed methods and apparatus in effectuating forming or positioning bumps of a metallic material on the surface of electrical contacts on the substrates through the feed of metallic wires, the leading ends of which prior to contact with the electrical contacts on the substrate are electrically deformed into a spherical or bump-shaped configuration, whereupon the remaining wire or rod-like material is then severed through the intermediary of suitable cutting devices. These particular methods which are employed in forming and positioning the metallic bumps on semiconductor substrates through the aspect of deforming and severing leading end segments of metallic wires or rods may be continuously repeated or employed in simultaneous multiple operation in a ganged apparative structure.

2. Discussion of the Prior Art

Mae et al. U.S. Pat. No. 6,098,868 describes a bump forming method and bump bonder for which locates and mounts metallic bumps onto electrical contacts on the surface of a semiconductor substrate. In effect, this is implemented through the advancing of a continuous wire element, the leading end of which is electrically deformed into a spherical component and then applied to the contact on the substrate surface, bonded thereto and thereafter the remaining metallic element severed therefrom so as to produce the bump.

Similarly, Bando U.S. Pat. No. 5,953,624 also provides for a bump forming method, wherein through the implementation of sequential steps, a metallic rod or bending wire having a spherical leading end electrically formed thereon, has the latter advanced so as to be applied to the surface of an electrical element on a substrate, such as for a semiconductor device, with the resultant bump being flattened to a predetermined degree, bonded to the electrical element on the surface of the semiconductor device and substrate. Thereafter the remaining length of metallic bonding wire or rod element is severed from the formed bump by means of suitable cutting elements, and withdrawn to be able to implement a subsequent similar operation.

Although the foregoing methods and apparatus provide for the positioning and attachment of bumps to the surfaces of electric contacts on semiconductor substrates, the prior art in this area of producing electronic packages is primarily directed to having the rods or bonding wires with preformed spherical leading ends which are to subsequently form the bumps upon being attached to the surfaces of electrical contacts on the substrate.

SUMMARY OF THE INVENTION

In contrast with the foregoing state-of-the technology, rather than locating and bonding bumps of metallic conductive material formed from the leading ends of wires or rods on the surface of electrical contacts located on the surface of a substrate of a semiconductor device, pursuant to the present invention it is intended to provide and form metallic inserts interiorly of holes or apertures in substrates, such holes generally being through-holes. Upon the insertion of the leading end of a continuous metallic wire or rod element into the aperture or hole through being fed by suitable apparatus, a ball or cylindrical enlargement is formed at the leading end of the wire within the substrate aperture or hole through heat generated by an arc from an electrode having an electrical current applied thereto, or by means of a laser and the like. Thereupon, the appropriate spherical or cylindrically enlarged member having been formed within the substrate or hole, the wire feed apparatus releases the extending portion of the wire and is retracted therefrom, while a suitable cutting arrangement, such as a laser device, severs the extending wire portion from the formed spherical or cylindrical member located within the hole. The resultingly severed wire portion is then retracted, as is also the laser device which has severed from the wire the sphere or cylindrical enlargement remaining in the hole.

The foregoing may be implemented through the utilization of an apparatus which singly or individually forms spheres, metallic balls or cylindrical enlargements within therewith aligned holes in the substrate, or alternatively, may be constituted of a ganged apparatus for simultaneously forming a plurality of such spheres or enlargements of metallic material each severed from a plurality of metallic wire elements in, respectively, a therewith aligned plurality of holes which are provided in the substrate, through basically a large-scale or mass produced manufacturing operation.

Accordingly, it is an object of the present invention to provide an apparatus for forming solid spherical or cylindrical elements of a conductive metallic material within at least one through-hole provided in a substrate from a continuous length of a wire or rod, and thereafter severing the remaining protruding portion of the rod or wire therefrom.

A more specific object is to provide an apparatus for inserting the leading end of a metallic rod or wire into at least one through-hole provided in a substrate of a semiconductor device, and thereafter deforming the material within the hole through the application of an electrical current into a predetermined enlarged spherical or cylindrical configuration, and thereafter severing and retracting the remaining protruding portion of the wire therefrom, while enabling the severed sphere or cylindrical segment to remain within the at least one through hole.

Another object of the invention resides in the provision of a method in controllably deforming into a spherical or cylindrical enlargement the leading end portion of a metallic wire or rod which is inserted into a hole provided in a substrate of a semiconductor device, through the application of heat produced by an electric current or later, and thereafter severing and retracting therefrom the remaining protruding length of the wire or rod material while permitting the spherical or cylindrical enlargement to remain in the hole.

A still further object resides in the provision of a method for simultaneously forming a plurality of deformed spherical or cylindrical metallic elements within holes formed in a substrate of a plurality of semiconductor device, wherein the elements are formed at the leading end of a continuous length of a rod or wire material while inserted in the therewith aligned hole, and then severing and retracting the remaining protruding portion of each rod or wire material therefrom so as to produce pluralities of specifically configured electrically conductive metallic inserts in the various therewith associated through-holes provided in the substrate.

BRIEF DESCRIPTION OF THE ACCOMPANYING DRAWINGS

Reference may now be made to the following detailed description of a preferred embodiment of the invention, taken in conjunction with the accompanying drawings, in which FIGS. 1 though 8 represent, respectively, sequential process steps in a diagrammatic illustration of an apparatus employed in the formation of at least one spherical metallic element a hole provided in a substrate of preferably a semiconductor device.

DETAILED DESCRIPTION OF A PREFERRED EMBODIMENT OF THE INVENTION

Referring to FIG. 1, there is diagrammatically illustrated in traverse cross-section, a fragmentary portion of a substrate 10 of a semiconductor device, which may be constituted of an organic laminate. A through hole 12 is formed in the substrate, and may be one of an array of through-holes as may be desired by the particular physical applications and need of an electronic package which has the laminate 10 of the semiconductor device forming a constituent thereof.

Figure 2:
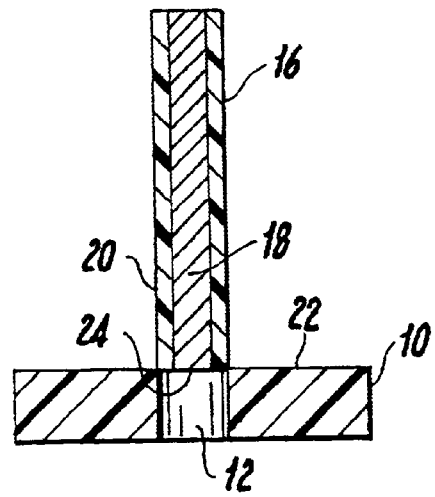

A wire feed arrangement 14, such as a sleeve 16 housing a length of metallic wire or rod material 18, and which includes wire clamping structure 20 is adapted to advance the wire towards the surface of the substrate 10 in alignment with the hole 12 in the substrate, as shown in FIG. 2 of the drawings, in which the wire feed sleeve 16 contacts the upper surface 22 of the substrate 10 in alignment with the hole 12 provided therein. At that point in time, the leading end 24 of the wire material 18, the latter of which is oriented perpendicular to the upper surface 22 of the substrate 10, is aligned with the upper end of hole 12.

Figure 3:
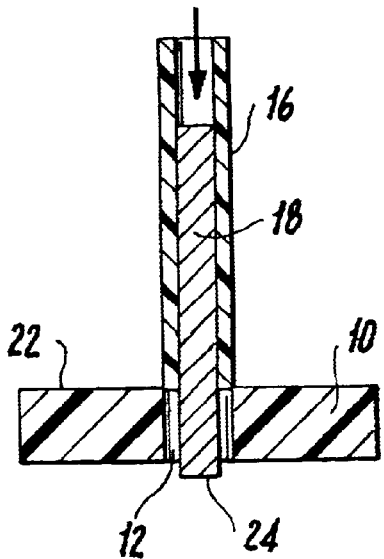

As shown in FIG. 3 of the drawings, which represents a further step in the method of producing the solid spherical or cylindrical metallic element within the hole 12 in the laminate or substrate 12, there is illustrated the leading end 24 of the wire material 18 which has now been advanced through the hole 12 such that the leading end projects slightly out of the lower surface 26 of the substrate 10. In this instance, the hole 12 is shown to be a through-hole with the leading end 24 of the wire slightly projecting below the lower surface of the laminate or substrate.

Figure 4:
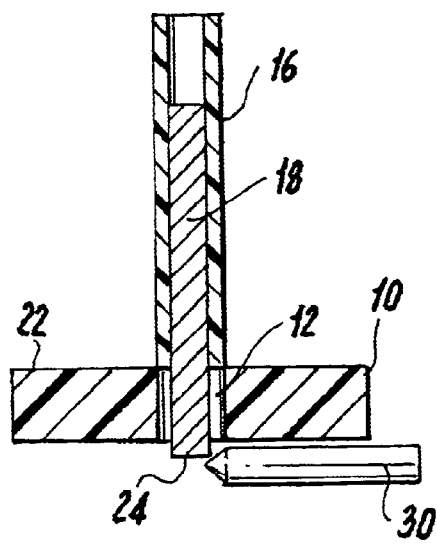
Figure 5:
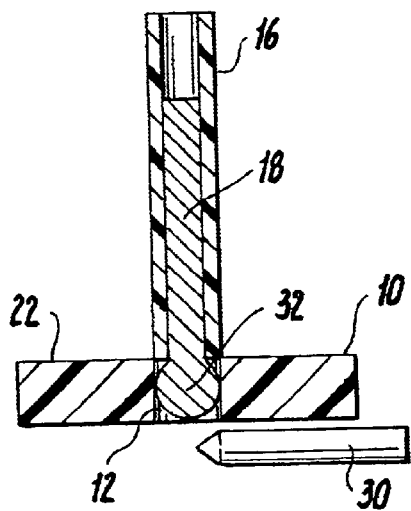

As represented in FIG. 4 of the drawings, an electrode 30 is then moved into proximity with the leading end 24 of the wire material 18, and an electrical current generated, as shown in FIG. 5 of the drawings producing an electrical arc the heat of which causes the leading end 24 of the wire material 18 to melt and essentially deform into a ball or spherical element 32 of enlarged size within the confines of the hole 12, and of a diameter substantially that of the diameter of the hole. Instead of the electrode 30, there may be employed a laser or other suitable means to heat and melt the leading end 24 of wire material 18. It is also possible that, rather than deforming the wire end 24 into the spherical or ball shaped configuration 32, there may be produced a cylindrical deformation of the leading end 24 of the wire material 18 within the hole 12, although for purposes of simplicity only the spherical or ball-shaped configuration has been shown herein.

Figure 6:
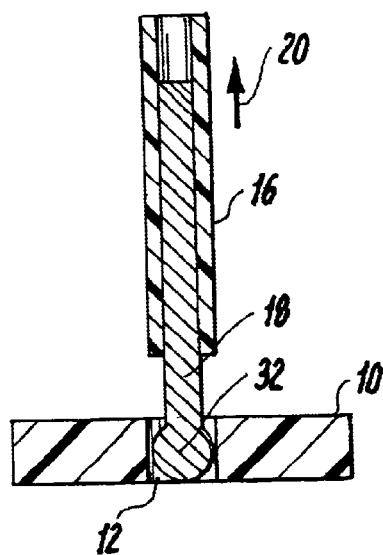
Figure 7:
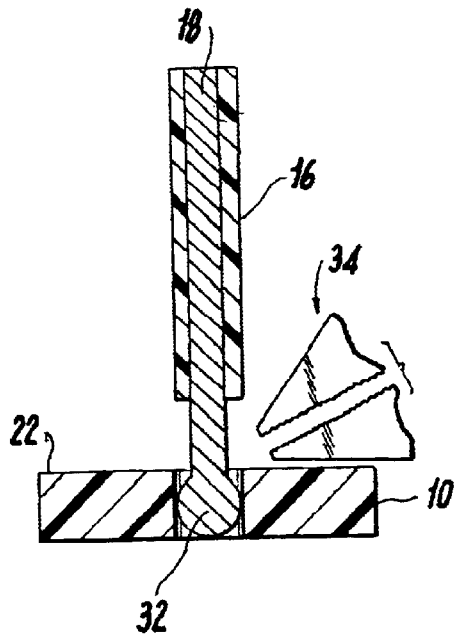
Figure 8:
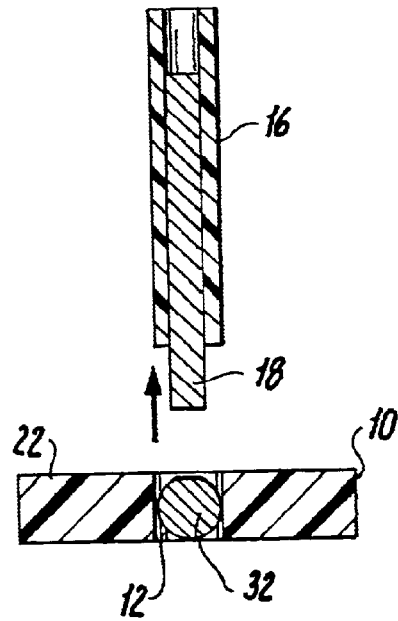

Referring to FIG. 6 of the drawings, upon completion of the deformation of the leading end 24 of the wire material within the hole 12 of the substrate 10 into a sphere or ball-shaped enlargement 32, while unclamping the wire, the wire feed mechanism 16 is retracted, leaving the wire 18 in position. Thereafter, as shown in FIG. 7 of the drawings, a suitable cutting mechanism 34, which may comprise a laser trim head, is advanced so as to be positioned proximate the upper surface 22 of the substrate 10 and to be able to sever the wire 18 extending upwardly and outwardly of the hole 12 from the formed ball or spherically shaped element 32 which is located within the hole 12. This will enable the severed sphere 32 of the metallic wire material (or cylindrical portion) to remain within the hole 12 as shown in FIG. 8 of the drawings, while the wire advancing and retracting arrangement 20 together with the wire material clamped therein is then withdrawn. Concurrently, the laser cutting device or trim head 34 is also retracted away from the site of the hole 12 leaving the deformed metallic spherical (or cylindrical) element 32 fixed within the hole.

The foregoing method may then be readily repeated for other through-holes 12 provided in the substrate 10 by simply aligning the wire feed arrangement 20 clamping the wire material 18 with another particular hole 12, and then repeating the method steps as described hereinbefore.

Alternatively, in the event that it is intended to produce large numbers of such spheres (or cylindrical portions) 32 in a plurality of holes 12 in one or more substrates 10 for semiconductor devices, it is possible to provide an operationally ganged construction of a plurality of wire feed arrangements 20 which are at predetermined relationship with each other in aligned correlation with the spacing of various holes in the substrate, and which can be concurrently or simultaneously advanced so as to simultaneously produce the balls or cylindrical elements at the wire leading ends as described hereinabove. This would adapt the inventive apparatus and method to large scale or mass production techniques which are highly desirable in the electronic packaging technology.

From the foregoing, it becomes readily apparent that pursuant to the present invention there is described a simple and novel arrangement and method of producing such metallic inserts, in the form of either spheres or cylinders within holes formed in the substrates for semiconductor devices.

While the invention has been particularly shown and described with respect to preferred embodiments thereof, it will be understood by those skilled in the art that the foregoing and other changes in form and detail may be made therein without departing from the spirit and scope of the invention.

What is claimed is:

1. A method of inserting a conductive material into a through-hole provided in a substrate; comprising the steps of:

aligning a continuous length of said conductive material with said hole;

advancing the leading end of said conductive material into said hole;

imparting heat to the portion of the conductive material which has been inserted into said hole so as to melt said portion and form a conductive insert in said hole; and severing the remaining conductive material extending outwardly of said hole from said formed conductive insert.

2. A method as claimed in claim 1, wherein said remaining conductive material is retracted from said substrate subsequent to the forming and severing of the conductive insert in said hole.

3. A method as claimed in claim 1, wherein said heat is imparted to the portion of conductive material in said hole through the application of an electrical are generated by an electrode located proximate said conductive material.

4. A method as claimed in claim 1, wherein said heat is produced by a laser.

5. A method as claimed in claim 1, wherein said heat deforms said conductive insert in said hole into a ball-shaped member.

6. A method as claimed in claim 4, wherein said ball-shaped member has an expanded diameter substantially in conformance with the diameter of said hole in said substrate.

7. A method as claimed in claim 3, wherein, said leading end portion of the conductive material is advanced so as to protrude from a lower end of said hole so as to enable said heat to melt and deform the conductive material in said hole.

8. A method as claimed in claim 1, wherein said remaining length of conductive material extending upwardly from of said hole is severed from said conductive insert portion in said hole through cutting structure.

9. A method as claimed in claim 8, wherein said cutting structure comprises a laser trim head for severing said upwardly extending remaining length of conductive material from the conductive insert portion in said hole through the application of laser energy.

10. A method as claimed in claim 1, wherein said conductive material comprises a continuous length of a metallic wire which has a leading end portion advanced through said hole and a severed remaining length subsequently retracted therefrom through wire aligning and advancing devices.

11. An arrangement for inserting a conductive material into a hole provided in a substrate; comprising:

a device for aligning a continuous length of said conductive material with said hole;

said device advancing the leading end of said conductive material into said hole;

a heat generating device for imparting heat to the portion of the conductive material which has been inserted into said hole so as to melt said portion and form a conductive insert in said hole; and cutting structures for severing the remaining conductive material extending outwardly of said hole from said formed conductive insert.

12. An arrangement as claimed in claim 11, wherein said aligning and advancing device retracts remaining conductive material from said substrate subsequent to the forming and severing of the conductive insert in said hole.

13. An arrangement as claimed in claim 11, wherein said heat generating means imparts heat to the leading end portion of conductive material in said hole through the application of an electrical arc generated by an electrode in proximity to said conductive material.

14. An arrangement as claimed in claim 11, wherein said heat generating device comprises a laser.

15. An arrangement as claimed in claim 11, wherein said heat generating device deforms said conductive insert in said hole into a ball-shaped member.

16. An arrangement as claimed in claim 15, wherein said ball-shaped member is formed into an expanded diameter substantially in conformance with the diameter of said hole in said substrate.

17. An arrangement as claimed in claim 13, wherein said leading end portion of the conductive material is advanced so as to protrude from a lower end of said hole so as to enable said heat imparting device to deform and melt the conductive material in said hole.

18. An arrangement as claimed in claim 11, wherein said remaining severed length of conductive material extending upwardly from said hole is severed from said conductive insert portion in said hole through said cutting structure.

19. An arrangement as claimed in claim 18, wherein said cutting structure comprises a laser trim head for severing said upwardly extending remaining length of conductive material from the conductive insert portion in said hole through the application of laser energy.

20. An arrangement as claimed in claim 11, wherein said conductive material comprises a continuous length of a metallic wire which is advanced towards and aligned with said hole and subsequently retracted therefrom through said wire aligning and advancing devices.

* * * * *